(12) United States Patent
Farshchian et al.

(10) Patent No.: US 10,349,561 B2
(45) Date of Patent: Jul. 9, 2019

(54) COOLING ELECTRONIC DEVICES IN A DATA CENTER

(71) Applicant: Google LLC, Mountain View, CA (US)

(72) Inventors: Soheil Farshchian, San Jose, CA (US); Emad Samadiani, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/208,951

(22) Filed: Jul. 13, 2016

(65) Prior Publication Data

US 2017/0303441 A1   Oct. 19, 2017

Related U.S. Application Data

(60) Provisional application No. 62/323,276, filed on Apr. 15, 2016.

(51) Int. Cl.
   *F28F 3/04* (2006.01)
   *H05K 7/20* (2006.01)
   (Continued)

(52) U.S. Cl.
   CPC ..... *H05K 7/20809* (2013.01); *F28D 15/0266* (2013.01); *F28D 15/0275* (2013.01);
   (Continued)

(58) Field of Classification Search
   CPC .......... H05K 7/20809; H05K 7/20318; H05K 7/20327; H05K 7/20409; F28D 15/02
   See application file for complete search history.

(56) References Cited

U.S. PATENT DOCUMENTS 4,777,561 A   10/1988   Murphy et al.
4,884,168 A   11/1989   August et al.
(Continued)

FOREIGN PATENT DOCUMENTS

CN   1355415 A   6/2002
CN   202632192 U   12/2012
(Continued)

OTHER PUBLICATIONS

WO2015107899 English Machine Translation—Retrieved Oct. 2017.*
(Continued)

*Primary Examiner* — Cassey D Bauer
*Assistant Examiner* — Jenna M Hopkins
(74) *Attorney, Agent, or Firm* — Fish & Richardson P.C.

(57) ABSTRACT

A data center cooling system includes a modular heat sink and a working fluid. The modular heat sink includes an evaporator configured to thermally contact a heat-generating electronic device to receive heat from the data center heat-generating electronic device; a condenser coupled to the evaporator and configured to transfer the heat from the heat-generating electronic device into a cooling fluid; and a plurality of transport tubes that fluidly couple the evaporator and the condenser, at least one of the plurality of transport tubes including an open end positioned in the evaporator and a closed end positioned in the condenser. The working fluid vaporizes in the evaporator based on receipt of the heat from the heat-generating electronic device, and circulates, in vapor phase, from the evaporator to the condenser in the transport member, and circulates, in liquid phase, from the condenser to the evaporator.

31 Claims, 10 Drawing Sheets

(51) Int. Cl.
*F28D 15/02* (2006.01)
*F28D 15/04* (2006.01)
*F28F 13/18* (2006.01)
*F28F 21/08* (2006.01)
*F28F 23/00* (2006.01)
*H01L 23/427* (2006.01)

(52) U.S. Cl.
CPC ........... *F28D 15/04* (2013.01); *F28D 15/046* (2013.01); *F28F 3/04* (2013.01); *F28F 3/048* (2013.01); *F28F 13/187* (2013.01); *F28F 21/085* (2013.01); *F28F 21/089* (2013.01); *F28F 23/00* (2013.01); *H05K 7/20309* (2013.01); *H05K 7/20318* (2013.01); *H05K 7/20327* (2013.01); *H05K 7/20336* (2013.01); *H05K 7/20409* (2013.01); *H01L 23/427* (2013.01)

(56) References Cited

U.S. PATENT DOCUMENTS

| | | | |
|---|---|---|---|
| 4,941,526 A * | 7/1990 | Nilsson | F28D 15/06 165/274 |
| 5,768,104 A | 6/1998 | Salmonson et al. | |
| 5,907,475 A | 5/1999 | Babinski et al. | |
| 5,953,930 A | 9/1999 | Chu et al. | |
| 5,998,863 A | 12/1999 | Kobayashi et al. | |
| 6,055,157 A | 4/2000 | Bartilson | |
| 6,151,215 A | 11/2000 | Hoffman | |
| 6,477,847 B1 | 11/2002 | Bonaquist et al. | |
| 6,549,408 B2 | 4/2003 | Berchowitz | |
| 6,550,255 B2 | 4/2003 | Rudick et al. | |
| 6,657,121 B2 | 12/2003 | Garner | |
| 6,761,212 B2 | 7/2004 | DiPaolo | |
| 6,775,137 B2 | 8/2004 | Chu et al. | |
| 6,804,117 B2 | 10/2004 | Phillips et al. | |
| 6,910,637 B2 | 6/2005 | Hsieh et al. | |
| 6,924,981 B2 | 8/2005 | Chu et al. | |
| 6,972,365 B2 | 12/2005 | Garner | |
| 7,025,129 B2 | 4/2006 | Chiu | |
| 7,130,191 B2 | 10/2006 | Lin et al. | |
| 7,231,961 B2 | 6/2007 | Alex et al. | |
| 7,286,351 B2 | 10/2007 | Campbell et al. | |
| 7,309,911 B2 | 12/2007 | Bartley et al. | |
| 7,318,322 B2 | 1/2008 | Ota et al. | |
| 7,397,662 B2 | 7/2008 | Oyamada | |
| 7,403,384 B2 | 7/2008 | Pflueger | |
| 7,564,685 B2 | 7/2009 | Clidaras et al. | |
| 7,599,184 B2 | 10/2009 | Upadhya et al. | |
| 7,650,928 B2 * | 1/2010 | Bhatti | F28D 1/0476 165/104.26 |
| 7,701,714 B2 | 4/2010 | Shabany | |
| 7,719,837 B2 | 5/2010 | Wu et al. | |
| 7,958,935 B2 | 6/2011 | Belits et al. | |
| 8,031,464 B2 | 10/2011 | Adkins et al. | |
| 8,077,463 B2 | 12/2011 | Lee | |
| 8,130,497 B2 * | 3/2012 | Kondo | H05K 7/20818 165/104.26 |
| 8,164,902 B2 | 4/2012 | Matsushima et al. | |
| 8,345,425 B2 | 1/2013 | Toyoda et al. | |
| 8,422,218 B2 | 4/2013 | Fried et al. | |
| 8,644,020 B2 | 2/2014 | Lau et al. | |
| 8,731,733 B2 | 5/2014 | Patel et al. | |
| 8,773,854 B2 * | 7/2014 | Rice | F25B 21/02 165/104.21 |
| 9,335,751 B1 | 5/2016 | Farshchian et al. | |
| 9,398,731 B1 | 7/2016 | Imwalle et al. | |
| 9,939,205 B2 * | 4/2018 | Sun | F28D 15/0266 |
| 2002/0053726 A1 | 5/2002 | Mikubo et al. | |
| 2002/0062648 A1 | 5/2002 | Ghoshal | |
| 2003/0128508 A1 | 7/2003 | Faneuf et al. | |
| 2003/0128516 A1 | 7/2003 | Faneuf et al. | |
| 2004/0070941 A1 * | 4/2004 | Ghosh | F28D 15/0266 361/700 |
| 2004/0225816 A1 | 11/2004 | Leigh et al. | |
| 2005/0217829 A1 | 10/2005 | Belits | |
| 2005/0248922 A1 * | 11/2005 | Chu | H05K 7/20727 361/700 |
| 2006/0005980 A1 | 1/2006 | Garner | |
| 2006/0232231 A1 | 10/2006 | Chen | |
| 2007/0042514 A1 | 2/2007 | Wu et al. | |
| 2007/0201204 A1 | 8/2007 | Upadhya | |
| 2007/0209782 A1 | 9/2007 | Wyatt et al. | |
| 2007/0242438 A1 * | 10/2007 | Belits | F28D 15/0266 361/700 |
| 2007/0263355 A1 | 11/2007 | Yu et al. | |
| 2008/0013283 A1 | 1/2008 | Gilbert et al. | |
| 2008/0043442 A1 | 2/2008 | Strickland et al. | |
| 2008/0055848 A1 | 3/2008 | Hamburgen et al. | |
| 2008/0247137 A1 * | 10/2008 | Dautert | G06F 1/20 361/703 |
| 2009/0011908 A1 | 1/2009 | Patel et al. | |
| 2009/0027856 A1 | 1/2009 | McCoy | |
| 2009/0133866 A1 | 5/2009 | Campbell | |
| 2009/0154104 A1 * | 6/2009 | Kondo | G06F 1/20 361/700 |
| 2009/0284924 A1 | 11/2009 | Konshak et al. | |
| 2010/0032142 A1 | 2/2010 | Copeland et al. | |
| 2010/0073863 A1 * | 3/2010 | Matsushima | H05K 7/20245 361/679.46 |
| 2010/0107658 A1 | 5/2010 | Cockrell | |
| 2011/0182033 A1 | 7/2011 | Tissot et al. | |
| 2012/0268877 A1 * | 10/2012 | Rice | F25B 21/02 361/679.4 |
| 2014/0014303 A1 * | 1/2014 | Rice | H05K 7/20809 165/104.21 |
| 2014/0090814 A1 | 4/2014 | Kondou et al. | |
| 2014/0146466 A1 | 5/2014 | Lau et al. | |
| 2014/0198451 A1 | 7/2014 | Kuo | |
| 2014/0332187 A1 | 11/2014 | MacDonald et al. | |
| 2014/0345829 A1 * | 11/2014 | Kang | H01L 23/427 165/104.21 |
| 2015/0174709 A1 | 6/2015 | Rice et al. | |
| 2015/0184949 A1 * | 7/2015 | So | F28D 15/0266 361/700 |
| 2016/0081224 A1 * | 3/2016 | Terava | F25B 23/00 361/700 |
| 2016/0085277 A1 | 3/2016 | Samadiani et al. | |
| 2016/0286685 A1 * | 9/2016 | Joshi | H01L 23/427 |
| 2016/0348985 A1 * | 12/2016 | Sun | F28D 15/0275 |
| 2017/0153064 A1 * | 6/2017 | Lan | F28D 15/046 |
| 2017/0153066 A1 * | 6/2017 | Lin | F28D 15/0266 |

FOREIGN PATENT DOCUMENTS

| | | | | |
|---|---|---|---|---|
| CN | 103733746 A | 4/2014 | | |
| CN | 103931279 A | 7/2014 | | |
| EP | 1669710 | 6/2006 | | |
| EP | 2170030 | 3/2010 | | |
| EP | 2784812 A2 * | 10/2014 | ............ | F28D 15/02 |
| JP | WO 2012147265 A1 * | 11/2012 | ............ | F28D 15/02 |
| JP | WO 2015107899 A1 * | 7/2015 | ........ | F28D 15/0266 |
| JP | WO 2016104729 A1 * | 6/2016 | ............ | F28D 15/02 |
| JP | 6062516 B1 * | 1/2017 | ............ | F28D 15/02 |
| JP | 6117288 B2 * | 4/2017 | ............ | F28D 15/02 |
| TW | 200829145 | 7/2008 | | |
| TW | 200829145 A * | 7/2008 | | |
| TW | 201414145 | 4/2014 | | |
| WO | 2002077547 | 10/2002 | | |
| WO | 2007012108 | 2/2007 | | |
| WO | 2012164261 | 12/2012 | | |
| WO | WO 2012166086 | 12/2012 | | |
| WO | 2014087635 | 6/2014 | | |
| WO | 2015004920 | 1/2015 | | |

OTHER PUBLICATIONS

TW200829145A English Machine Translation—Retrieved Oct. 2017.*
Heat Pipes Review, Opportunities and Challenges—Faghri (2014).*
WO 2012147265 English Machine Translation—Retrieved Apr. 2018.*

(56) References Cited

OTHER PUBLICATIONS

CoolIT Systems, "Rack DCLC—Product Guide," 2009, 8 pages.
Hioki, "The Cray-1 Supercomputer" San Jose State University, 2002, retrieved on Sep. 8, 2010 from http://www.openloop.com/education/classes/sjsu_engr/engr_compOrg/spring2002/studentProjects/Andie_Hioki/Cray1withAdd.htm, 16 pages.
Khonsue, "Experimental on the liquid cooling system with thermoelectric for personal computer," *Heat and Mass Transfer*, Oct. 2012, vol. 48, Issue 10, pp. 1767-1771.
Kolodzey, "CRAY-1 Computer Technology" IEEE Transactions on Components, Hybrids, and Manufacturing Technology, vol. CHMT-4, No. 2, Jun. 1981, pp. 181-186.
Modine, "Remembering the CRAY-1 When Computers and Furniture Collide" The Register, Jan. 5, 2008, retrieved on Sep. 8, 2010 from http://www.theregister.co.uk/2008/01/05/tob_cray1/print.html, 7 pages.
Russell, "The CRAY-1 Computer System" Communications of the ACM, vol. 21, No. 1, Jan. 1978, pp. 63-72.
Iyengar et al., U.S. Appl. No. 14/534,566, filed Nov. 6, 2014, 48 pages.
Taiwanese Office Action issued in Application No. 105140151, dated Aug. 15, 2017, 17 pages (with English Translation).
Extended European Search Report issued in Application No. 16206920.7, dated Sep. 8, 2017, 9 pages.
Chinese Office Action issued in Chinese Application No. 201611235781.8, dated Oct. 15, 2018, 20 pages (with English translation).

\* cited by examiner

COOLING ELECTRONIC DEVICES IN A DATA CENTER

CROSS-REFERENCE TO RELATED APPLICATION

This application claims priority under 35 U.S.C. § 119 to U.S. Provisional Patent Application Ser. No. 62/323,276, entitled "Cooling Electronic Devices in a Data Center," and filed on Apr. 15, 2016, the entire contents of which are incorporated by reference in their entirety herein.

TECHNICAL FIELD

This document relates to systems and methods for providing cooling to electronic equipment, such as computer server racks and related equipment in computer data centers.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

In an example implementation, a data center cooling system includes a modular heat sink and a working fluid. The modular heat sink includes an evaporator configured to thermally contact a heat-generating electronic device to receive heat from the data center heat-generating electronic device; a condenser coupled to the evaporator and configured to transfer the heat from the heat-generating electronic device into a cooling fluid; and a plurality of transport tubes that fluidly couple the evaporator and the condenser, at least one of the plurality of transport tubes including an open end positioned in the evaporator and a closed end positioned in the condenser. The working fluid vaporizes in the evaporator based on receipt of the heat from the heat-generating electronic device, and circulates, in vapor phase, from the evaporator to the condenser in the transport member, and circulates, in liquid phase, from the condenser to the evaporator.

In an aspect combinable with the example implementation, the working fluid includes water, and the evaporator includes copper.

In another aspect combinable with any of the previous aspects, the water includes deionized or reverse osmosis (RO) water.

Another aspect combinable with any of the previous aspects further includes a fan positioned to circulate a cooling fluid over the condenser.

In another aspect combinable with any of the previous aspects, the fan is mounted on a frame of a server board sub-assembly that supports the heat-generating electronic device.

Another aspect combinable with any of the previous aspects further includes including a heat transfer surface positioned within an inner volume of the evaporator.

In another aspect combinable with any of the previous aspects, the heat transfer surface includes copper fins integrally formed with the evaporator.

In another aspect combinable with any of the previous aspects, the copper fins extend upward from a bottom surface of the inner volume of the evaporator, and a height of the finned structure is less than an operating liquid level of the working fluid in the evaporator.

In another aspect combinable with any of the previous aspects, at least a portion of the heat transfer surface is coated with a porous coating.

In another aspect combinable with any of the previous aspects, the porous coating includes copper particles.

In another aspect combinable with any of the previous aspects, the condenser is mounted vertically above the evaporator.

In another aspect combinable with any of the previous aspects, the condenser is mounted to a frame of a server board sub-assembly that supports the heat-generating electronic device.

In another aspect combinable with any of the previous aspects, the plurality of transport tubes include heat pipes that each include a wick structure.

In another aspect combinable with any of the previous aspects, the closed ends of the plurality of transport tubes are positioned in respective areas of the condenser.

In another aspect combinable with any of the previous aspects, the respective areas of the condenser include distinct thermal areas of the condenser.

In another example implementation, a method for cooling data center electronic devices includes vaporizing at least a portion of a working fluid in an evaporator of a modular heat sink with heat from a heat-generating electronic device in thermal contact with the evaporator; circulating a vapor phase of the working fluid from the evaporator through respective open ends of a plurality of transport tubes that fluidly couple the evaporator to a condenser of the modular heat sink, the respective open ends positioned in the evaporator; condensing at least a portion of the vapor phase of the working fluid, in respective closed ends of the plurality of transport tubes positioned in the condenser, to a liquid phase of the working fluid; and circulating the liquid phase of the working fluid to the evaporator through the plurality of transport tubes.

In an aspect combinable with the example implementation, the working fluid includes water, and the evaporator includes copper.

In another aspect combinable with any of the previous aspects, the water includes deionized or reverse osmosis (RO) water.

Another aspect combinable with any of the previous aspects further includes circulating a cooling airflow over the condenser.

In another aspect combinable with any of the previous aspects, circulating the cooling airflow includes circulating the cooling airflow with a fan mounted on a frame of a server board sub-assembly that supports the heat-generating electronic device.

Another aspect combinable with any of the previous aspects further includes transferring heat from the heat-generating electronic device, through a heat transfer surface positioned within an inner volume of the evaporator, to the liquid phase of the working fluid.

In another aspect combinable with any of the previous aspects, at least a portion of the heat transfer surface is coated with a porous coating including copper particles.

In another aspect combinable with any of the previous aspects, the condenser is mounted vertically above the evaporator.

In another aspect combinable with any of the previous aspects, the plurality of transport tubes include heat pipes that each include a wick structure.

In another aspect combinable with any of the previous aspects, the closed ends of the plurality of transport tubes are positioned in respective areas of the condenser.

In another aspect combinable with any of the previous aspects, the respective areas of the condenser include distinct thermal areas of the condenser.

One, some, or all of the implementations of the modular heat sink according to the present disclosure may include one or more of the following features. For example, while the heat generation of the CPUs, GPUs, and ASICs is increasing, the heat source surface areas are getting smaller as well. This results in large heat fluxes concentrated on the chip surface to be cooled. Also, the main die surface area is usually much smaller than the package lid, and the heat sink contact surface. This results in local hot spots on the lid surface area and causes large temperature gradients on the surface of the device. All of these design challenges may increase the thermal resistances from the junction to the ambient of the conventional heat sink solutions and may limit the cooling capacity. A copper heat spreader is often the conventional solution used to spread the heat and handle hot spot cooling. But, this solution may result in an inferior thermal performance of the heat sink. Implementations of the modular heat sink according to the present disclosure may solve one or more of these problems, as well as other problems associated with cooling electronic heat-generating devices. For example, implementations of the modular heat sink according to the present disclosure may have a low thermal resistance relative to conventional heat transfer devices used to cool CPUs, GPUs, ASICs, and other electronic devices, due to, for instance, reduced soldering and an integral copper design. Further, in some implementations, the modular heat sink may provide for more uniform heat transfer through multiple transport tubes that are coupled between an evaporator and a condenser. The transport tubes may be tailored to a particular heat transfer capacity or heat removal rate to more efficiently remove heat from heat-generating electronic devices relative to conventional techniques. In addition, in some implementations, the modular heat sink may more efficiently cool heat-generating devices by using water as a working fluid, which may have higher conduction properties relative to dielectric refrigerants. As another example, implementations of the modular heat sink may be less sensitive to the orientation of the heat-generating electronic device, which typically affects performance of conventional cooling devices, such as thermosiphons. Thus, trays, motherboards, and devices mounted thereon may be arranged in various orientations without affecting the operation of the modular heat sink.

The details of one or more embodiments are set forth in the accompanying drawings and the description below. Other features, objects, and advantages will be apparent from the description and drawings, and from the claims.

DETAILED DESCRIPTION

Figure 1:
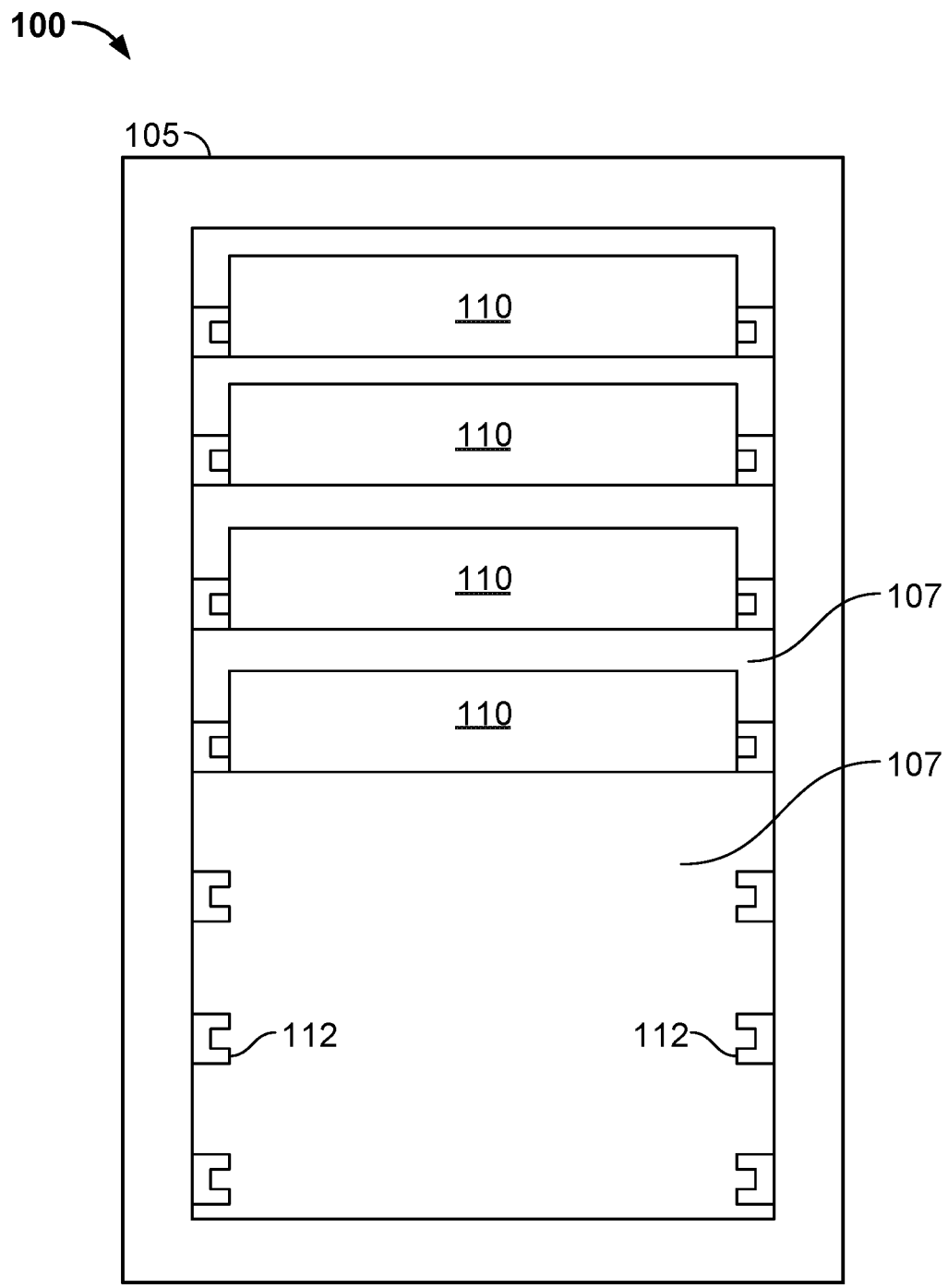
FIG. 1 illustrates a schematic view of a server rack and a server-rack sub-assembly configured to mount within a rack used in a data center environment and cooled by a modular heat sink according to the present disclosure.

This document discusses a modular heat sink that is operable to cool one or more electronic heat-generating devices, such as devices located on a server rack sub-assembly (e.g., a server tray) in a data center. In some implementations, the modular heat sink may provide hot spot cooling and three dimensional distribution of heat generated by such devices to handle high heat fluxes. In some implementations, the modular heat sink according to the present disclosure includes an evaporator, a transport tube, and a condenser.

In some implementations of the modular heat sink according to the present disclosure, the evaporator includes a pocketed copper block with a heat transfer surface (e.g., fin structures). The fins in the fin structure may be machined or skived, or could be soldered or brazed as a separate part to the evaporator pocketed copper block. The fins can be plate fins or pin fins and can be coated with copper porous particles to increase the evaporation rate and reduce the thermal resistance. In some aspects, the evaporator may be fully formed of copper, which may allow for easier implementations of finned surfaces than other materials. Further, fabrication of sintered copper may be safer (e.g., compared to sintered aluminum) for use in the modular heat sink. In some aspects, using copper may allow for a single-piece evaporator (e.g., with no joints or connections that may cause leaks or weak points).

In some implementations of the modular heat sink according to the present disclosure, a working fluid is vaporized in the evaporator as heat is transferred from the heat-generating electronic device(s) to the evaporator. The vaporized working fluid is circulated (e.g., naturally or forced) to the condenser through the transport tube, where it is condensed to release the heat transferred from the device(s) to a cooling fluid (e.g., a cooling liquid or airflow). The condensed working fluid is circulated (e.g., naturally or forced) back to the evaporator through the transport tube. In some implementations of the modular heat sink according to the present disclosure, the working fluid is water (e.g., purified, deionized, or reverse osmosis). In some aspects, a water level is higher than a fin height in the evaporator, such that pool boiling occurs to increase a two-phase heat transfer rate and also increase a maximum heat flux. Water, for example, may have a higher capacity (e.g., by an order of magnitude) to transfer heat than non-water refrigerants. Thus, a layer of the water in contact with the evaporator surface may more easily change phase to a vapor, thereby transferring more heat to the water, as compared to non-water refrigerants. Further, a modular heat sink using water may operate at a much lower pressure (e.g., due to water's boiling point at 100° C.) than conventional non-water refrigerant based thermosiphons. For example, conventional thermosiphons may not operate with water as a refrigerant because the vapor-liquid pressure differential of such a device may not be sufficient to naturally circulate the working fluid (i.e., the water) between the hot side and the cold sides of the thermosiphon.

In some implementations of the modular heat sink according to the present disclosure, the fins (e.g., coated) may primarily handle hot spot cooling. For example, the fins increase the heat transfer surface area while the porous structure increases the heat transfer rate. The fin structure (e.g., shape, numbers, dimensions, pitch) and the porous structure (e.g., material, size, and porosity) can be modified for each design and placed exactly on top of the local hot spots to handle various heat generation maps of the heat-generating electronic devices. For example, if a device, such as a microprocessor, has a particular power map the fins may be modified to reduce the temperature gradient and thermal resistance of the heat sink.

In some implementations of the modular heat sink according to the present disclosure, the three-dimensional nature of the heat spreading may also help handle high heat fluxes over smaller device areas. Pool boiling over coated fins area can result in an effective thermal conductivity of about 3-5 times of a conventional copper heat spreader and about two times of an industrial vapor chamber (e.g., up to 1000 W/cm$^2$).

In some implementations of the modular heat sink according to the present disclosure, the transport tube may be coated by a porous structure. The porous coating may be optimized to maximize the capillary effect, which may increase the maximum power capacity of the modular heat sink.

In some implementations of the modular heat sink according to the present disclosure, the soldering resistance found in conventional heat pipes and copper heat spreader or vapor chambers in conventional designs may be eliminated. For example, the transport tube may transfer the working fluid vapor directly from the evaporator to the condenser. This results in lower thermal resistance as possible.

Figure 4A:
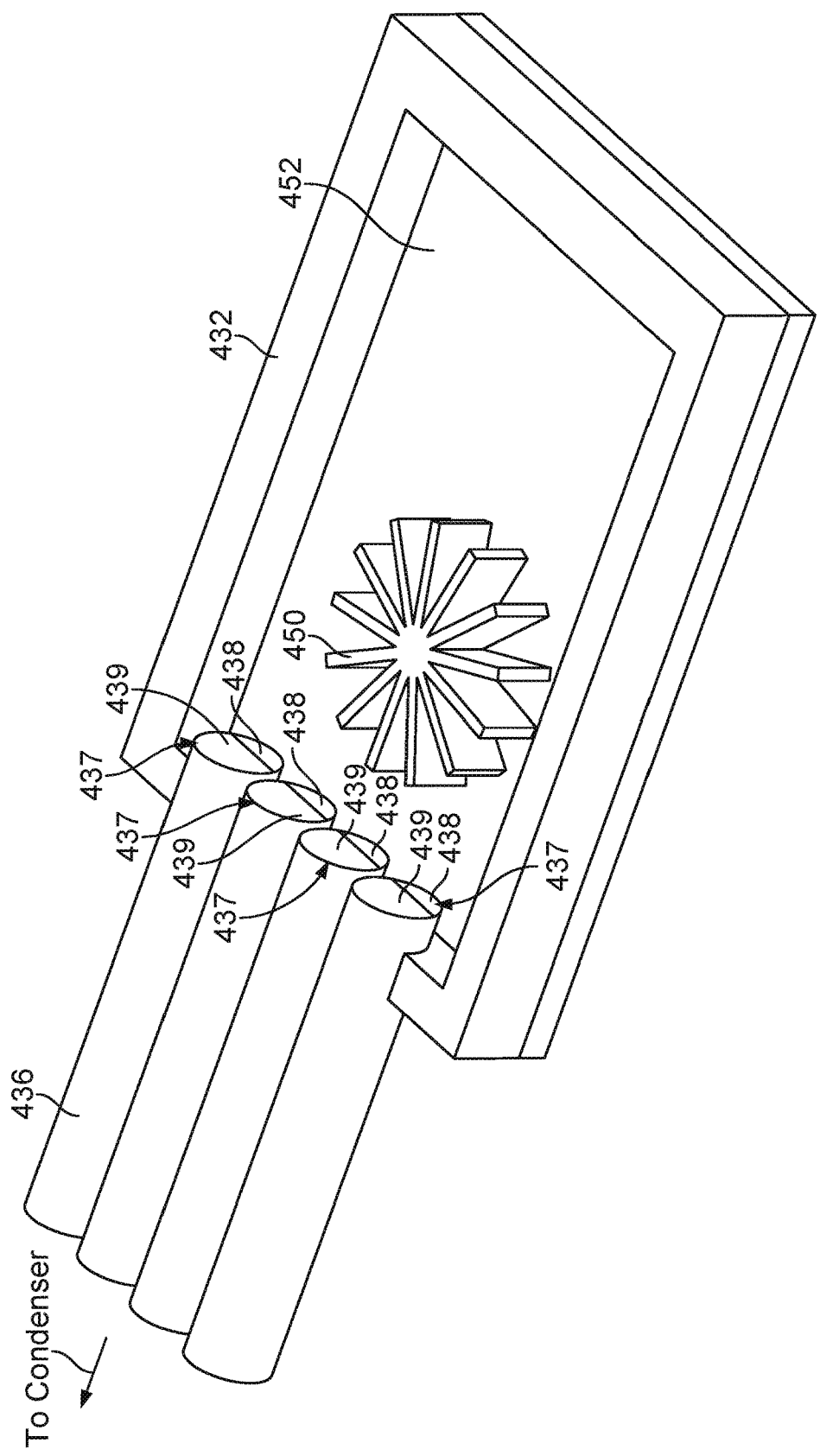
FIGS. 4A-4B illustrate schematic isometric views of portions of other example implementations of a modular heat sink for a server-rack sub-assembly according to the present disclosure.
Figure 4B:
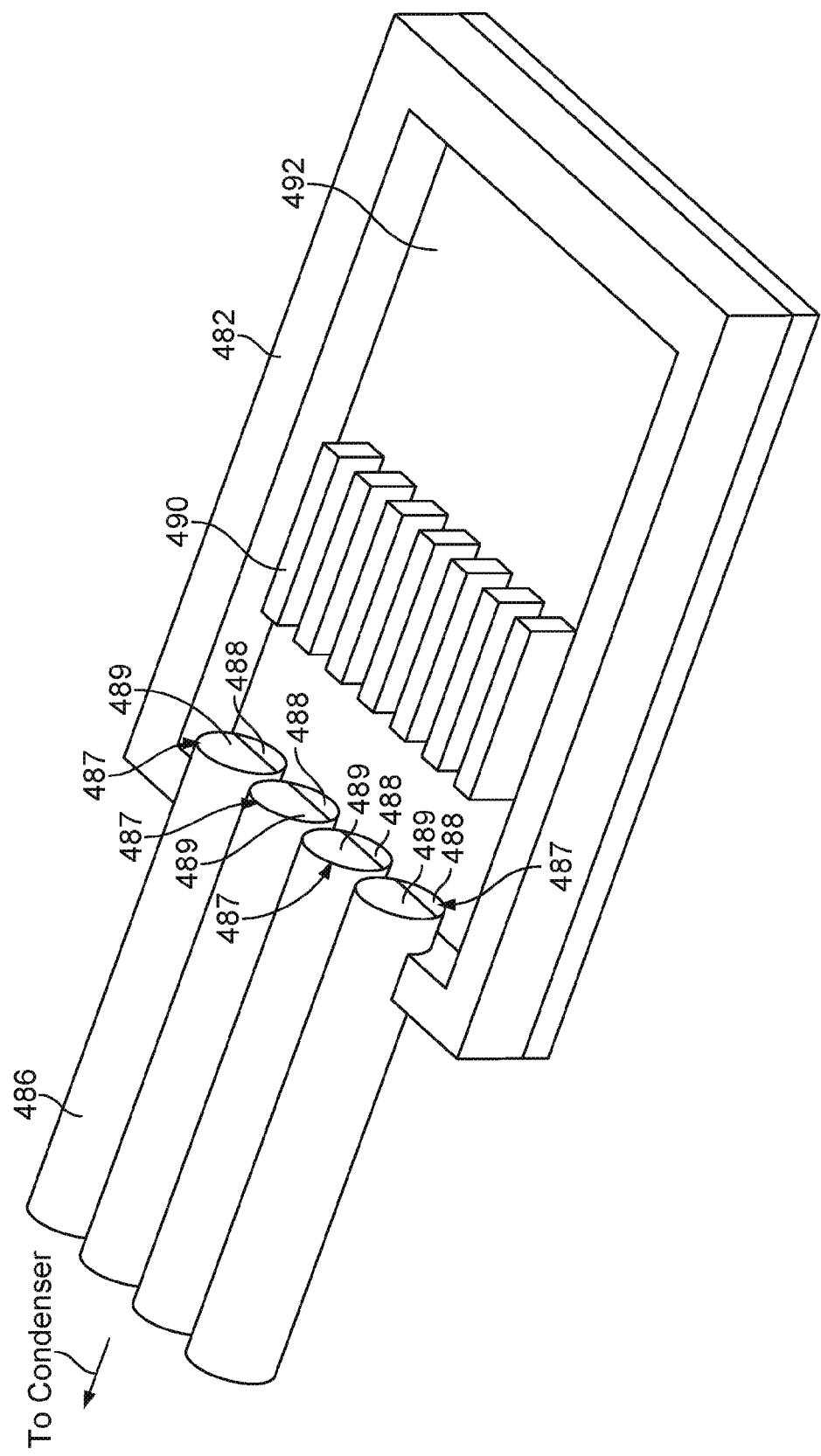

In some implementations of the modular heat sink according to the present disclosure, the transport tube may be comprised of multiple heat pipes (e.g., open tubes with a wick structure within the tubes). In some aspects, direct transportation of the working fluid vapor to multiple heat pipes, as shown in FIGS. 4A-4B, may result in more uniform power distribution between the heat pipes. In contrast, when heat pipes are soldered to a copper heat spreader in conventional techniques, there may be a temperature gradient across the heat pipes, which may result in less power transferred through the certain heat pipes. In some implementations of the modular heat sink according to the present disclosure, the transport tube heat pipes can have the same effectiveness, resulting in less thermal resistance in the transfer path and also will result in higher fin efficiency and lower condenser resistance as well.

Further, in some implementations of the modular heat sink according to the present disclosure, if a heat pipe of the transport tube is exposed to a cooler sink in the condenser compared to other heat pipes (e.g., to a lower temperature cooling airflow), the condensation may accelerate in that heat pipe and therefore it would transfer more heat compared to other heat pipes. This feature may act as a self-balancing effect, which further improves the modular heat sink performance.

In some implementations of the modular heat sink according to the present disclosure, the modular heat sink can be used for different sized (e.g., height) heat-generating electronic devices. For example, the modular heat sink can be used for relatively short (e.g., 1 rack unit) servers or relatively tall (e.g., 2 rack units) servers.

In some implementations of the modular heat sink according to the present disclosure, the modular heat sink may be modular and may take several forms. For example, the condenser may be adjacent to or on top of the evaporator. The evaporation surface improvements may be a porous wick, groves, micro fins or any other features that improve bubble nucleation in the solid-liquid interface. The condenser may be air cooled, a liquid cold plate or any other cooling interface (e.g., two phase refrigerant, chilled water, condenser water, Peltier type cooler). In some aspects, multiple evaporators may be connected to one condenser. In some aspects, each evaporator may connect to more than one condenser. For example, one fin stack on top of the evaporator and one fin stack located remotely.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 2A:
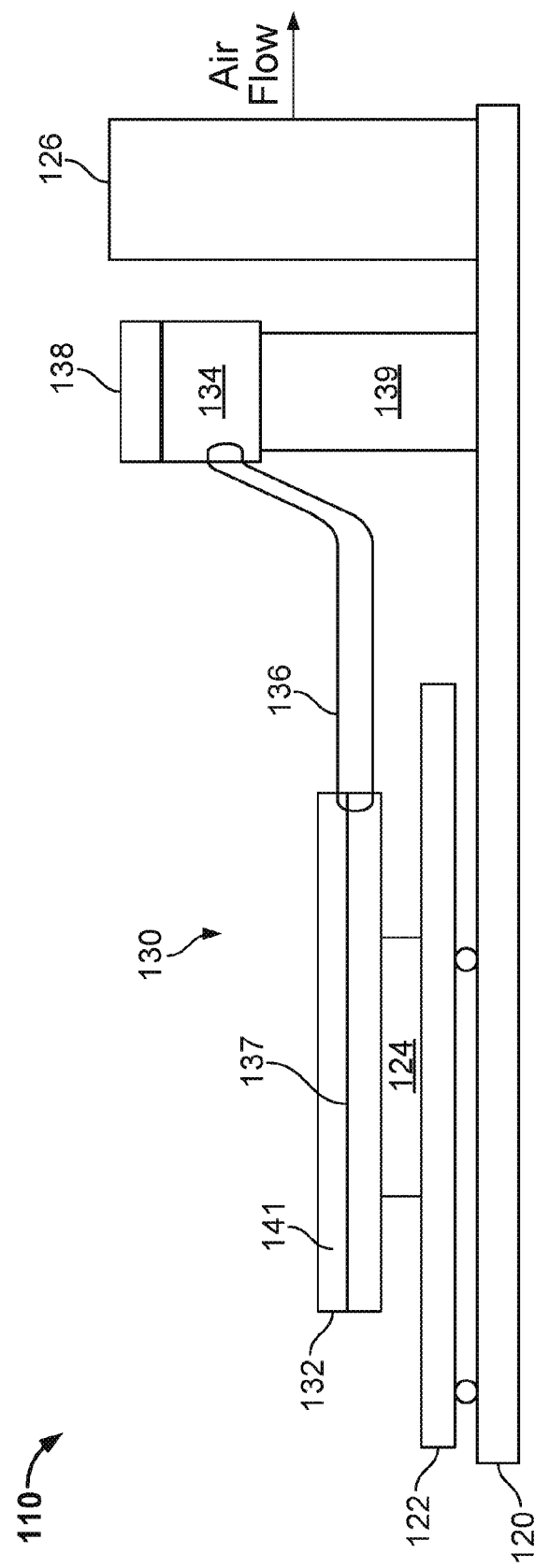
FIGS. 2A-2B illustrate schematic side and top view, respectively, of an example implementation of a modular heat sink for a server-rack sub-assembly according to the present disclosure.
Figure 2B:
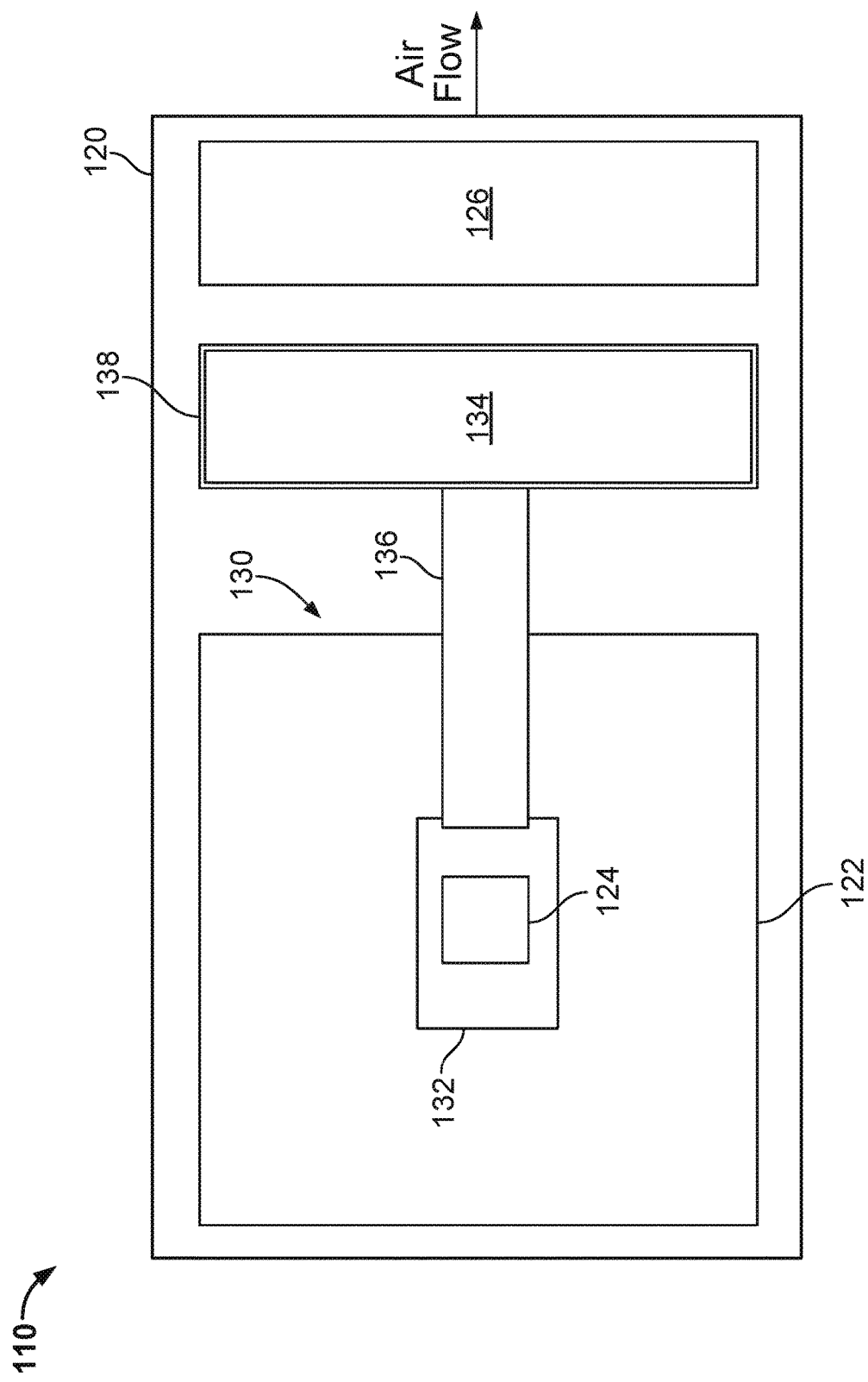

Referring to FIGS. 2A-2B, the server rack sub-assembly 110 includes a frame or cage 120, a printed circuit board 122, e.g., motherboard, supported on the frame 120, one or more heat-generating electronic devices 124, e.g., a processor or memory, mounted on the printed circuit board 122, and a modular heat sink 130. One or more fans 126 can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIGS. 2A-2B illustrate the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 2A illustrates the frame 120 as a flat plate, the frame 120 can include one or more side walls that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans 126 can be placed on the frame 120 so that air enters at the front edge (at the left hand side in FIGS. 2A-2B) of the server rack sub-assembly 110, closer to the front of the rack 105 when the sub-assembly 110 is installed in the rack 105, flows (as illustrated) over the motherboard 122, over some of the heat generating components on the motherboard 122, and is exhausted from the server rack assembly 110 at the back edge (at the right hand side), closer to the back of the rack 105 when the sub-assembly 110 is installed in the rack 105. The one or more fans 126 can be secured to the frame 120 by brackets. Thus, the fans 126 can pull air from within the frame 120 area and push the air after it has been warmed out the rack 105. An underside of the motherboard 122 can be separated from the frame 120 by a gap.

The modular heat sink 130 includes an evaporator 132, a condenser 134 mounted on a base 139, and a transport member 136 connecting the evaporator 132 to the condenser 134. The evaporator 132 contacts the electronic device 124 so that heat is drawn by conductive heat transfer from the electronic device 124 to the evaporator 132. For example, the evaporator 132 is in conductive thermal contact with the electronic device 124. In particular, the bottom of the evaporator 132 contacts the top of the electronic device 124.

In operation, heat from the electronic device 124 causes a working fluid (e.g., water) in the evaporator 132 to evaporate. As illustrated in FIG. 2A, the working fluid as a liquid 137 fills the evaporator 132 to a particular height within the volume of the evaporator 132, with working fluid vapor 141 (due to the transferred heat) above the liquid 137. The liquid 137, in some aspects, fills the evaporator 132 to a height above a finned surface within the evaporator 132 (not shown here). The evaporator 132, in this example, consists of a pocketed copper block with some fin structures (not shown). The fins could be machined/skived, or could be soldered/brazed as a separate part to the evaporator copper block. The fins can be plate fins or pin fins and can be coated with copper porous particles to increase the evaporation rate and reduce the thermal resistance.

The vapor 141 then passes through transport member 136 to the condenser 134. Heat is radiated away from the condenser 134, e.g., into air around the condenser 134 or into air blown or drawn by the one or more fans 126 that passes across the condenser 134, a heat transfer surface 138 (e.g., finned surface), or both, causing the working fluid to condense. As shown in FIG. 2A, the condenser 134 can be located between the one or more fans 126 from the evaporator 132, but could also be located on an opposite side of one or more of fans 126 (e.g., near an edge of the sub-assembly 110).

As shown in FIG. 2A, the transport member 136 is at a slight (non-zero) angle so that gravity causes the condensed working fluid to flow back through the transport member 136 to the evaporator 132. Thus, in some implementations, at least a portion of the transport member 136 is not parallel to the main surface of the frame 120. For example, the condenser-side end of the transport member 136 can be about 1-5 mm, e.g., 2 mm, above the evaporator-side end of the transport member 136. However, it is also possible for the transport member 136 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device.

During operation, the top surface of the working fluid (as a liquid) inside the condenser 134 may be above the top surface liquid height 137 of the working fluid in the evaporator 132, e.g., by 1 to 10 mm. It can be easier to achieve this with a transport member 136 that is at a slight (positive non-zero) angle, but proper selection of the thermal and mechanical properties of the working fluid (e.g., water) in view of the expected heat transport requirements for the modular heat sink 130 may still achieve this for a transport member 136 that is horizontal or at a slightly negative angle.

During operation, the liquid phase 137 of a working fluid can flow through a liquid conduit of the transport member 136, and a vapor phase 141 (or mixed vapor-liquid phase) of the working fluid can flow through a vapor conduit of the transport member 136. Further, in some aspects, the transport member 136 may include a wick structure, which helps circulate the liquid 137 back to the evaporator 132 (and the vapor 141 to the condenser 134) through capillary forces.

In some alternative implementations, the modular heat sink 130 can have multiple evaporators; and each evaporator can contact a different electronic device, or multiple evaporators could contact the same electronic device, e.g., if the electronic device is particularly large or has multiple heat generating regions. The multiple evaporators can be connected by the transport member 136 to the condenser 134 in series, e.g., a single transport member 136 connects the condenser 134 to a first evaporator and a second evaporator. Alternatively, some or all of the multiple evaporators can be connected by multiple transport members to the condenser 134 in parallel, e.g., a first transport member connects the condenser to a first evaporator, and a second transport member connects the condenser 134 to a second evaporator. Advantages of a serial implementation may be fewer tubes, whereas an advantage of parallel tubes is that the tube diameters can be smaller.

FIGS. 2A-2B illustrate a modular heat sink 130 in which a common transport member 136 is used for both the condensate flow from the condenser 134 to the evaporator 132 and for vapor (or mixed phase) flow from the evaporator 132 to the condenser 134. Thus, in this implementation the fluid coupling between the evaporator 132 and the condenser 134 consists of a combined condensate and vapor transfer line 136. A potential advantage of the combined condensate and vapor transfer line is that the transport member 136 can be connected to a side of the condenser, reducing the vertical height of the system relative to a system with a separate line for the vapor, since the vapor line is typically coupled to or near the top of the evaporator. The transport member 136 can be a flexible tube or pipe, e.g., of copper or aluminum.

Figure 3:
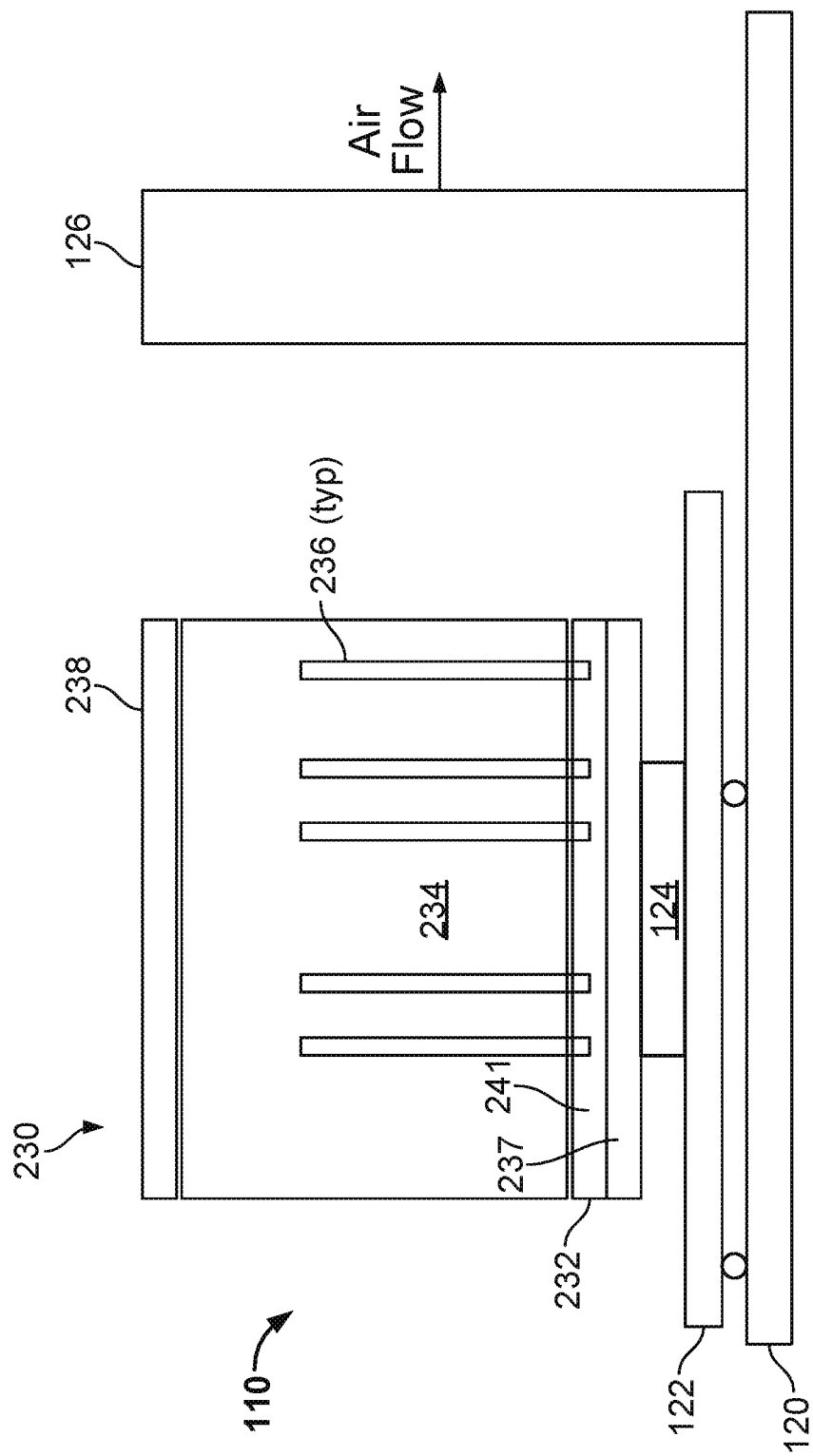
FIG. 3 illustrates a schematic side view of another example implementation of a modular heat sink for a server-rack sub-assembly according to the present disclosure.

Referring to FIG. 3, another example implementation of a modular heat sink 230 is shown with the server rack sub-assembly 110. As in FIGS. 2A-2B, the server-rack sub-assembly 110 includes a frame or cage 120, a printed circuit board 122, e.g., motherboard, supported on the frame 120, one or more heat-generating electronic devices 124, e.g., a processor or memory, mounted on the printed circuit board 122, and a modular heat sink 130. One or more fans 126 can also be mounted on the frame 120.

The modular heat sink 230 includes an evaporator 232, a condenser 234 mounted on top of the evaporator 232, and one or more transport members 236 connecting the evaporator 132 to the condenser 134. The evaporator 132 contacts the electronic device 124 so that heat is drawn by conductive heat transfer from the electronic device 124 to the evaporator 132. For example, the evaporator 132 is in conductive thermal contact with the electronic device 124. In particular, the bottom of the evaporator 132 contacts the top of the electronic device 124.

As shown in FIG. 3, the condenser 234 is vertically positioned directly above the evaporator 232, which in some aspects, may allow for space savings on the frame 120. A heat transfer surface 238 (e.g., fins) is mounted to a top of the condenser 234. In operation, heat from the electronic device 124 causes a working fluid (e.g., water) in the evaporator 232 to evaporate. As illustrated in FIG. 3, the working fluid as a liquid 237 fills the evaporator 232 to a particular height within the volume of the evaporator 232, with working fluid vapor 241 (due to the transferred heat) above the liquid 237. The liquid 237, in some aspects, fills the evaporator 232 to a height above a finned surface within the evaporator 232 (not shown here). The evaporator 232, in this example, consists of a pocketed copper block with some fin structures (not shown). The fins could be machined/skived, or could be soldered/brazed as a separate part to the evaporator copper block. The fins can be plate fins or pin fins and can be coated with copper porous particles to increase the evaporation rate and reduce the thermal resistance.

The vapor 241 then passes through transport member(s) 236 to the condenser 234. In some aspects, the natural variation in density of the water vapor 241 and the water liquid 237 in the evaporator 232 may circulate the vapor 241 into the condenser 234 through the transport members 236. Heat is radiated away from the condenser 234, e.g., into air around the condenser 234 or into air blown or drawn by the one or more fans 126 that passes across the condenser 234, the heat transfer surface 238 (e.g., finned surface), or both, causing the working fluid to condense.

During operation, the top surface of the working fluid (as a liquid) inside the condenser 234 is above the top surface liquid height 237 of the working fluid in the evaporator 232. During operation, in this example, the liquid phase 137 of a working fluid can flow downward through the transport member(s) 136 as (e.g., simultaneously) a vapor phase 141 (or mixed vapor-liquid phase) of the working fluid can flow upward through the transport member(s) 136.

In some alternative implementations, the modular heat sink 230 can have multiple evaporators; and each evaporator can contact a different electronic device, or multiple evaporators could contact the same electronic device, e.g., if the electronic device is particularly large or has multiple heat generating regions. The multiple evaporators can be connected by the transport member(s) 236 to the condenser 134 or to multiple condensers.

FIGS. 4A-4B illustrate schematic isometric views of portions of other example implementations of a modular heat sink for a server-rack sub-assembly. For example, FIG. 4A shows an evaporator 432 and transport member that includes multiple transport tubes 436 of a modular heat sink according to the present disclosure. The evaporator 432 includes a finned structure 450 (e.g., in a wagon-wheel formation) mounted or formed into an inner surface 452 of the evaporator 432. As shown in FIG. 4A, there are four transport tubes 436; in alternative implementations, there may be two, three, five, or another number of transport tubes 436. In some aspects, a number of transport tubes 436 may be determined based, at least in part, on a required or desired cooling capacity of the modular heat sink and a particular cooling capacity of each transport tube 436. Each transport tube 436 may be open to the evaporator 432 (e.g., a volume within the evaporator 432 that include a liquid phase and a vapor phase of a working fluid) and include a flow opening 437.

As shown, the flow opening 437 includes a liquid flow portion 438 and a vapor flow portion 439. In some aspects, while there may be no physical barrier separating the liquid flow portion 438 and the vapor flow portion 439, such portions are separate based on a phase of the working fluid that flows (e.g., to the evaporator 432 or to a condenser) within the transport tube 436 and, more particularly, due to a density difference between vapor working fluid and liquid working fluid. For example, liquid working fluid may flow from the condenser to the evaporator 432 within a bottom portion of the transport tube 436 that comprises the liquid flow portion 438. Vapor working fluid may flow from the evaporator 432 to the condenser within an upper portion of the transport tube 436 that comprises the vapor flow portion 439. Thus, in an example operation, a working fluid (e.g., water or refrigerant) may vaporize to a vapor phase by a transfer of heat from a heat-generating electronic device thermally coupled to the evaporator 432. The vaporized working fluid may flow through the vapor flow area 439 of the transport tube 436 to the condenser, where the vapor phase is cooled and condensed to a liquid phase (e.g., within the transport tube 436). The liquid phase may then flow back through the liquid flow area 438 to the evaporator 432 (e.g., to begin the vapor-liquid phase cycle again). In some aspects, one or more of the transport tubes 436 may be a heat pipe (e.g., with a wick structure) that is closed at a condenser end and open (as shown) at an evaporator end.

FIG. 4B shows an evaporator 482 and transport member 486 of a modular heat sink according to the present disclosure. The evaporator 482 includes a finned structure 490 (e.g., as parallel fins) mounted or formed into an inner surface 492 of the evaporator 482. As shown in FIG. 4B, there are four transport tubes 486; in alternative implementations, there may be two, three, five, or another number of transport tubes 486. In some aspects, a number of transport tubes 486 may be determined based, at least in part, on a required or desired cooling capacity of the modular heat sink and a particular cooling capacity of each transport tube 486. Each transport tube 486 may be open to the evaporator 482 (e.g., a volume within the evaporator 482 that include a liquid phase and a vapor phase of a working fluid) and include a flow opening 487.

As shown, the flow opening 487 includes a liquid flow portion 488 and a vapor flow portion 489. In some aspects, while there may be no physical barrier separating the liquid flow portion 488 and the vapor flow portion 489, such portions are separate based on a phase of the working fluid that flows (e.g., to the evaporator 482 or to a condenser) within the transport tube 486 and, more particularly, due to a density difference between vapor working fluid and liquid working fluid. For example, liquid working fluid may flow from the condenser to the evaporator 482 within a bottom portion of the transport tube 486 that comprises the liquid flow portion 488. Vapor working fluid may flow from the evaporator 482 to the condenser within an upper portion of the transport tube 486 that comprises the vapor flow portion 489. Thus, in an example operation, a working fluid (e.g., water or refrigerant) may vaporize to a vapor phase by a transfer of heat from a heat-generating electronic device thermally coupled to the evaporator 482. The vaporized working fluid may flow through the vapor flow area 489 of the transport tube 486 to the condenser, where the vapor phase is cooled and condensed to a liquid phase (e.g., within the transport tube 486). The liquid phase may then flow back through the liquid flow area 488 to the evaporator 482 (e.g., to begin the vapor-liquid phase cycle again). In some aspects, one or more of the transport tubes 486 may be a heat pipe (e.g., with a wick structure) that is closed at a condenser end and open (as shown) at an evaporator end.

As shown in these example portions of a modular heat sink, the transport members 436 and 486 are comprised of multiple heat pipes (e.g., with a wick structure therein) or transport tubes, as shown. For example, there may be a particular total cross-sectional flow area (e.g., flow areas 437 and 487) required for a working fluid liquid to flow back from the condenser to the evaporator (e.g., based on an amount of heat generated by the electronic devices in thermal contact with the evaporator). The total cross-sectional area may be split among multiple heat pipes or flow tubes, as shown. This may add redundancy to the flow transport of the modular heat sink, while also ensuring that, through proper spacing of the tubes in the evaporator and condenser, heat is uniformly transferred to/from the working fluid within these components. Thus, hot (or cold) spots in the working fluid may be reduced or eliminated.

In some aspects, a modular heat sink according to the present disclosure may be manufactured according to the following example process. The example steps may be performed serially, in parallel, or in a different order than that described herein. First, the evaporator, condenser, and transport tube parts may be manufactured by a stamping or a machining process (e.g., from copper or other material). Next, the evaporator fins are formed by skiving or soldered to the required area in the evaporator (e.g., within an inner volume of the evaporator, on a bottom surface of the volume). Next, a coating (e.g., porous coating of copper particles) is applied to at least portions of the transport tube and evaporator. Next, the transport member (e.g., as a single heat pipe or flow tube or multiple heat pipes or flow tubes) is soldered to the evaporator and condenser on the two ends. Next, the modular heat sink is purged and vacuumed and filled with the working fluid (e.g., water) and the fill tube is then sealed.

Figure 5A:
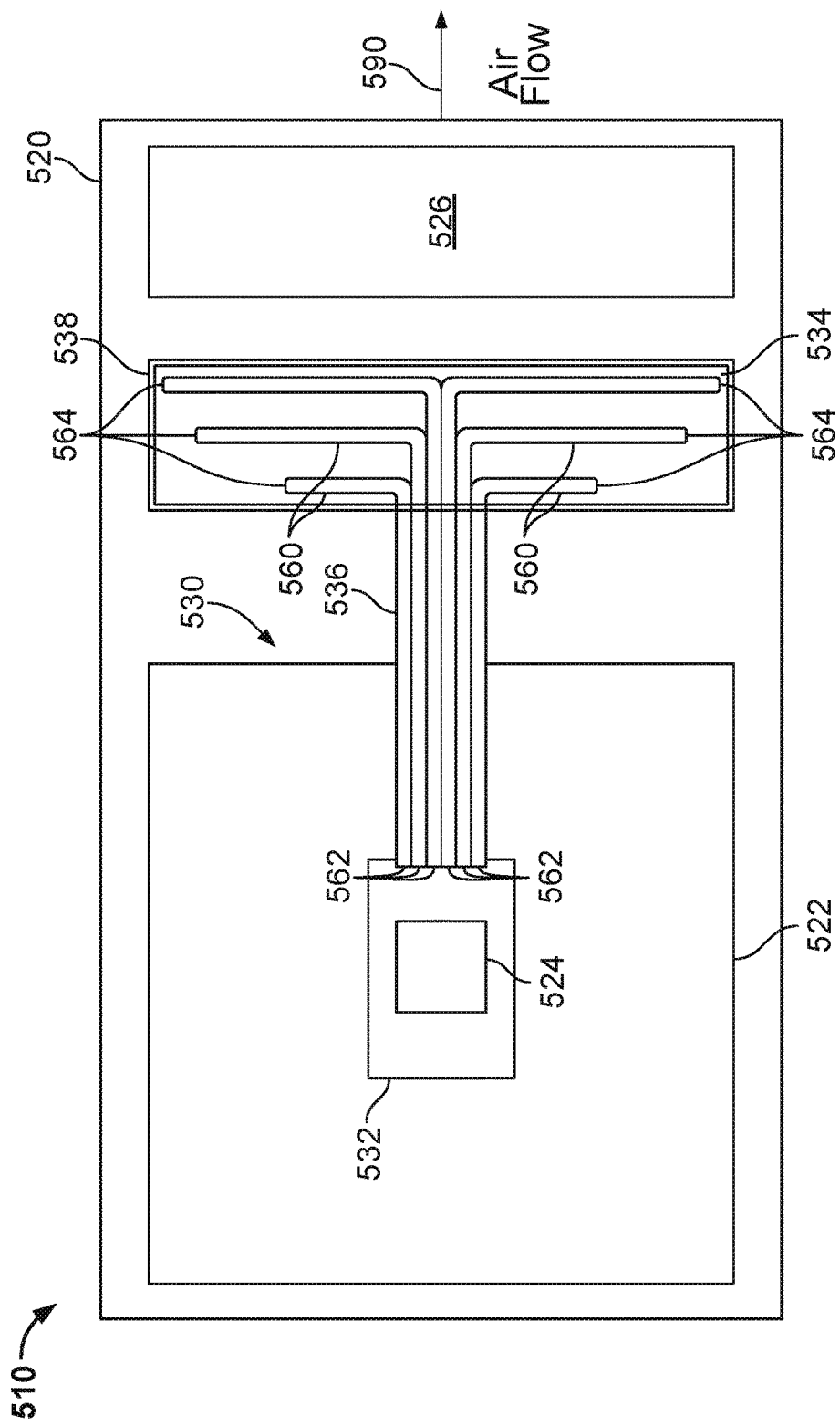
FIGS. 5A-5B illustrate top and side schematic views, respectively, of another example implementation of a modular heat sink for a server-rack sub-assembly according to the present disclosure.
Figure 5B:
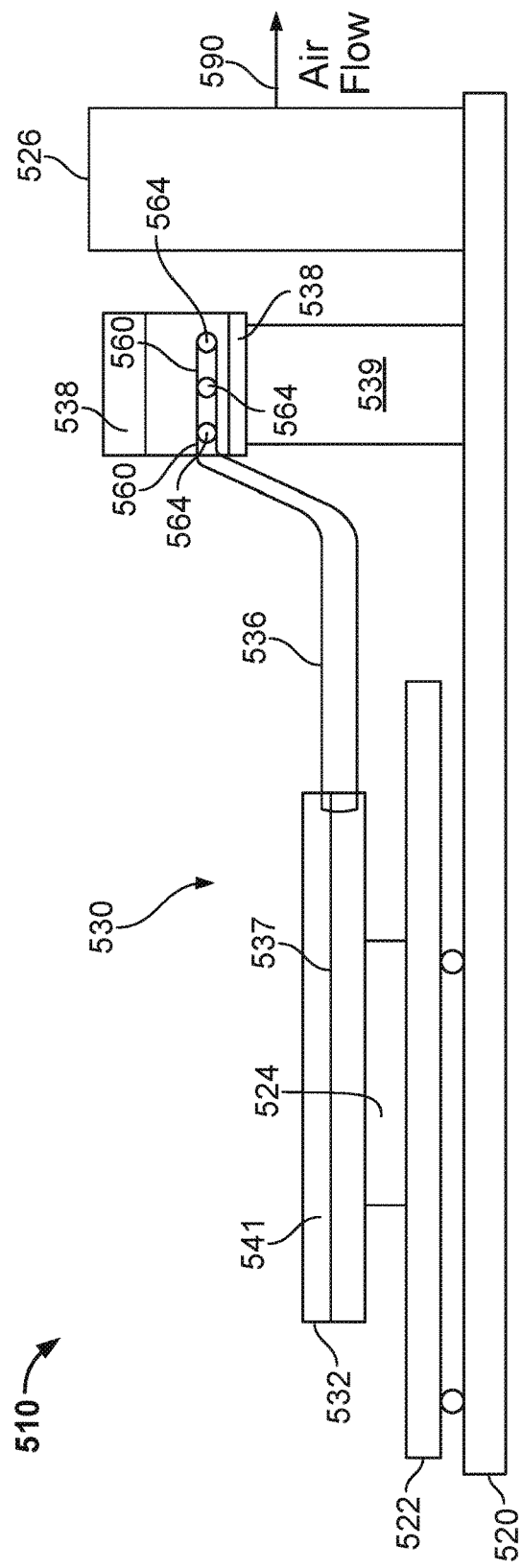

FIGS. 5A-5B illustrate top and side schematic views, respectively, of another example implementation of a modular heat sink 530 for a server-rack sub-assembly. In some aspects, the modular heat sink 530 may include multiple (e.g., two or more) transport tubes that fluidly connect an evaporator 532 with a condenser 534 to transfer heat from one or more heat-generating electronic devices 524 to an ambient environment within a working fluid. In the example modular heat sink 530, as shown, the condenser 534 is positioned aside the evaporator 532.

As shown in FIGS. 5A-5B, the server rack sub-assembly 510 includes a frame or cage 520, a printed circuit board 522, e.g., motherboard, supported on the frame 520, one or more heat-generating electronic devices 524, e.g., a processor or memory, mounted on the printed circuit board 522, and a modular heat sink 530. One or more fans 526 can also be mounted on the frame 520. The frame 520 can include or simply be a flat structure onto which the motherboard 522 can be placed and mounted, so that the frame 520 can be grasped by technicians for moving the motherboard into place and holding it in position within the rack 505. For example, the server rack sub-assembly 510 may be mounted horizontally in the server rack 505 such as by sliding the frame 520 into the slot 507 and over a pair of rails in the rack 505 on opposed sides of the server rack sub-assembly 510—much like sliding a lunch tray into a cafeteria rack. Although FIGS. 5A-5B illustrate the frame 520 extending below the motherboard 522, the frame can have other forms (e.g., by implementing it as a peripheral frame around the motherboard) or may be eliminated so that the motherboard itself is located in, e.g., slidably engages, the rack 505. In addition, although FIG. 5A illustrates the frame 520 as a flat plate, the frame 520 can include one or more side walls that project upwardly from the edges of the flat plate, and the flat plate could be the floor of a closed-top or open-top box or cage.

The illustrated server rack sub-assembly 510 includes a printed circuit board 522, e.g., a motherboard, on which a variety of components are mounted, including heat-generating electronic devices 524. Although one motherboard 522 is illustrated as mounted on the frame 520, multiple motherboards may be mounted on the frame 520, depending on the needs of the particular application. In some implementations, the one or more fans 526 can be placed on the frame 520 so that air enters at the front edge (at the left hand side in FIGS. 5A-5B) of the server rack sub-assembly 510, closer to the front of the rack 505 when the sub-assembly 510 is installed in the rack 505, flows (as illustrated) over the motherboard 522, over some of the heat generating components on the motherboard 522, and is exhausted from the server rack assembly 510 at the back edge (at the right hand side), closer to the back of the rack 505 when the sub-assembly 510 is installed in the rack 505. The one or more fans 526 can be secured to the frame 520 by brackets. Thus, the fans 526 can pull air from within the frame 520 area and push the air after it has been warmed out the rack 505. An underside of the motherboard 522 can be separated from the frame 520 by a gap.

The modular heat sink 530 includes an evaporator 532, a condenser 534 mounted on a base 539, and a transport member 536 connecting the evaporator 532 to the condenser 534. The evaporator 532 contacts the electronic device 524 so that heat is drawn by conductive heat transfer from the electronic device 524 to the evaporator 532. For example, the evaporator 532 is in conductive thermal contact with the electronic device 524. In particular, the bottom of the evaporator 532 contacts the top of the electronic device 524.

As shown in this example, the transport member 536 includes multiple transport tubes 560 that connect the evaporator 532 and the condenser 534. In this example, there are six transport tubes 560, however, there may be fewer (e.g., two through five) or more (e.g., more than six) transport tubes 560. As illustrated, one or more of the transport tubes 560 include an open end 562 that is open in a vapor phase 541 of the working fluid in the evaporator 532, and a closed end 564 that is positioned in a particular area of the condenser 534. In some examples, each transport tube 560 can be cooled independently. For example, each transport tube 560 can be placed within different condensers (e.g., different of multiple condensers 534) with different geometries or with different cooling medium(s). In further examples, each closed end 564 is positioned in an area of the condenser 534 that is thermally distinct from other areas of the condenser 534 (e.g., with little to no conductive heat transfer between adjacent areas of the condenser 534). Thus, in this example, the vapor phase 541 may fluidly travel into the open end 562 of the transport tube 560, and to the closed end 564 located in the condenser 534 (e.g., by pressure or thermal gradients).

In operation, heat from the electronic device 524 causes a liquid phase 537 of the working fluid (e.g., water or refrigerant) in the evaporator 532 to evaporate. As illustrated in FIG. 5A, the working fluid as the liquid phase 537 fills the evaporator 532 to a particular height within the volume of the evaporator 532, with working fluid vapor 541 (due to the transferred heat) above the liquid 537. The liquid 537, in some aspects, fills the evaporator 532 to a height above a finned surface within the evaporator 532 (not shown here).

The evaporator 532, in this example, consists of a pocketed copper block with some fin structures (not shown). The fins could be machined/skived, or could be soldered/brazed as a separate part to the evaporator copper block. The fins can be plate fins or pin fins and can be coated with copper porous particles to increase the evaporation rate and reduce the thermal resistance.

The vapor 541 then passes through the open ends 562 of the transport tubes 560 to the condenser 534. Heat is radiated away from the condenser 534, e.g., into air around the condenser 534 or into air blown or drawn by the one or more fans 526 that passes across the condenser 534, one or more heat transfer surfaces 538 (e.g., finned surface), or both, causing the vapor phase 541 of the working fluid to condense within the transport tubes 560 (e.g., within the closed ends 564). As shown in FIG. 5A, the condenser 534 can be located between the one or more fans 526 from the evaporator 532, but could also be located on an opposite side of one or more of fans 526 (e.g., near an edge of the sub-assembly 510).

As shown in FIG. 5A, the transport member 536 is at a slight (non-zero) angle so that gravity causes the condensed working fluid (e.g., the liquid phase 537) to flow back through the transport tubes 560, from the closed ends 564 back to the open ends 562, to the evaporator 532. Thus, in some implementations, at least a portion of the transport tubes 560 are not parallel to the main surface of the frame 520. For example, the condenser-side end of the transport tubes 560 can be about 1-5 mm, e.g., 2 mm, above the evaporator-side end of the transport tubes 560. However, it is also possible for the transport tubes 560 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device.

In the illustrated implementation, the liquid phase 537 of a working fluid can flow through a portion of the transport tubes 560 (e.g., a bottom portion or bottom half), and the vapor phase 541 (or mixed vapor-liquid phase) of the working fluid can flow through another portion of the transport tubes 560 (e.g., a top portion or a top half). Further, in some aspects, the transport tubes 560 may include respective wick structures, which helps circulate the liquid 537 back to the evaporator 532 (and the vapor 541 to the condenser 534) through capillary forces.

In some alternative implementations, the modular heat sink 530 can have multiple evaporators; and each evaporator can contact a different electronic device, or multiple evaporators could contact the same electronic device, e.g., if the electronic device is particularly large or has multiple heat generating regions. The multiple evaporators can be connected by the transport tubes 560 to the condenser 534 in series, e.g., all of the transport tubes 560 connects the condenser 534 to a first evaporator and a second evaporator. Alternatively, each of the multiple evaporators can be connected by a subset of the transport tubes 560 to the condenser 534 in parallel, e.g., a first subset of transport tubes 560 connects the condenser to a first evaporator, and a second subset of transport tubes 560 connects the condenser 534 to a second evaporator. Advantages of a serial implementation may be fewer tubes, whereas an advantage of parallel tubes is that the tube diameters can be smaller.

As shown in FIGS. 5A-5B, the closed ends 564 of the transport tubes 560 are positioned, and the transport tubes 560 terminate in, distinct areas of the condenser 534. As shown in FIG. 5B, the closed ends 560 may be positioned within a common plane within the condenser 534 but at differing distances from the fan 526. Thus, in some aspects, transport tubes 560 that have closed ends 560 further from the fan 526 may receive a cooling airflow 590 from the fan 526 that is cooler than the cooling airflow 590 received by transport tubes 560 with closed ends 560 that are positioned closer to the fan 526. In some examples, a particular location of each closed end 564 of the transport tubes 560 may be selected or designed to maximize heat transfer from the vapor phase 541 of the working fluid in the transport tubes 560 to the cooling airflow 590. For instance, it may be preferable or desirable to have each transport tube 560 have an equal or roughly equal heat transfer capacity. Thus, due to, for example, the different lengths of the transport tubes 560 (e.g., due to the different locations of the closed ends 564 of the various transport tubes 560), various cooling fluid temperatures (e.g., based on a distance between the fan 526 and a respective closed end 564 of a transport tube 560) may balance the heat transfer capacities across the transport tubes 560.

The described features can be used to design a cooling system with a much lower thermal resistance (e.g., relative to conventional techniques), which may also result in a heat-generating device (e.g., CPU or otherwise) with a uniform temperature. For example, transport tubes as described herein may have a heat transfer capacity ($Q_{max}$) that is proportional with an inverse of the effective length ($L_{eff}$) of the tube (e.g., $Q_{max}=3000/L_{eff}$). Also, a thermal resistance (R) between the surface of a heat-generating device and a cooling airflow at each transport tube contact location may equal to the corresponding temperature difference ($T_D$) divided by the heat capacity of the tube: $R=T_D/Q_{max}$. The thermal resistance itself is a function of the tube length and, if included, a wick structure. Thus, although each tube may experience different cooling fluid temperatures, its length and, if included, its wick structure can be selected in a way (e.g., using the equations above), which may result in a uniform temperature at the surface of the heat-generating device. In some aspects, a reduction in the surface temperature due to the described features may be about 5° C. or about 30% of the thermal resistance.

Figure 6A:
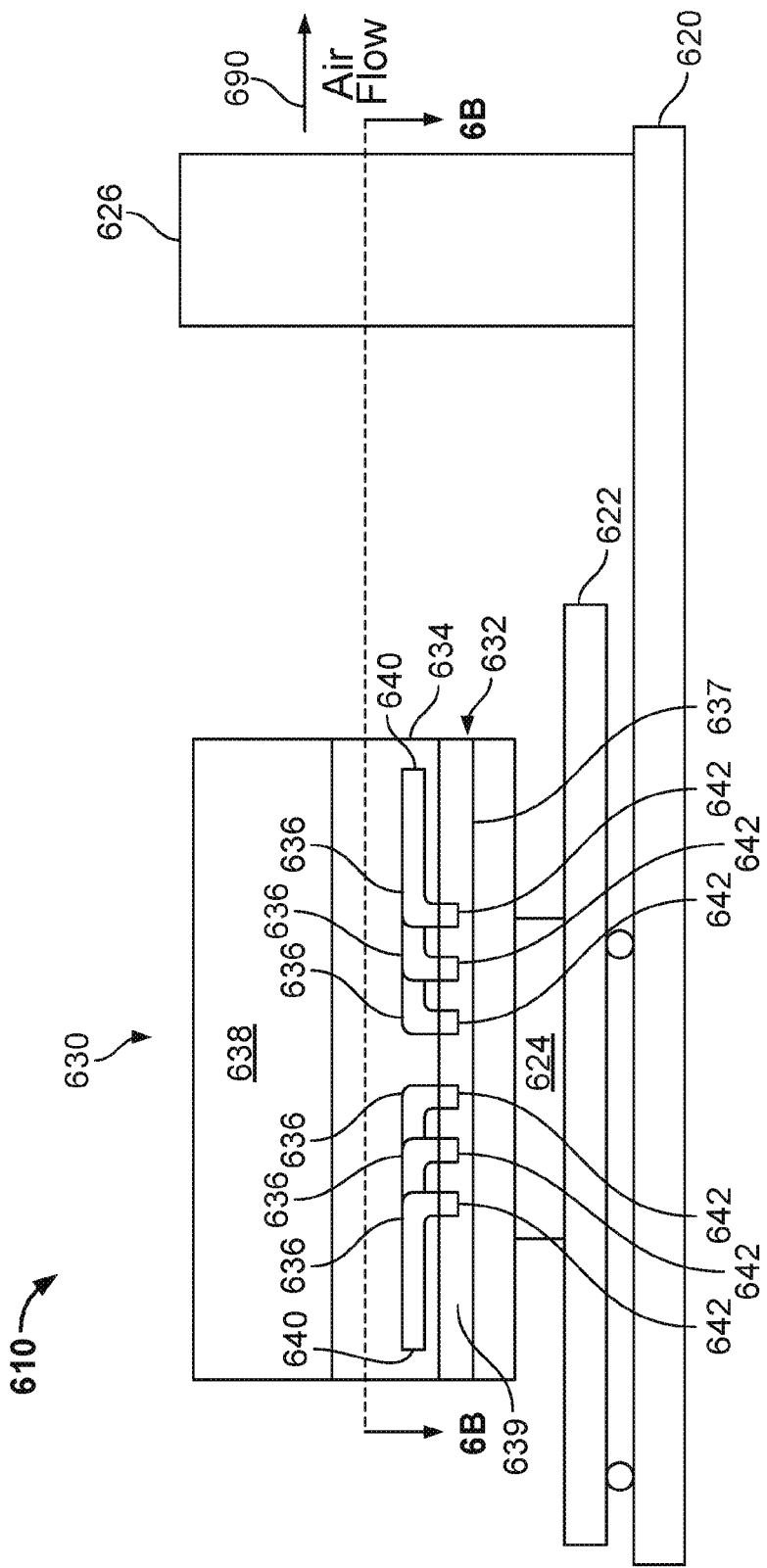
FIGS. 6A-6B illustrate a side and a sectional top schematic view, respectively, of another example implementation of a modular heat sink for a server-rack sub-assembly according to the present disclosure.
Figure 6B:
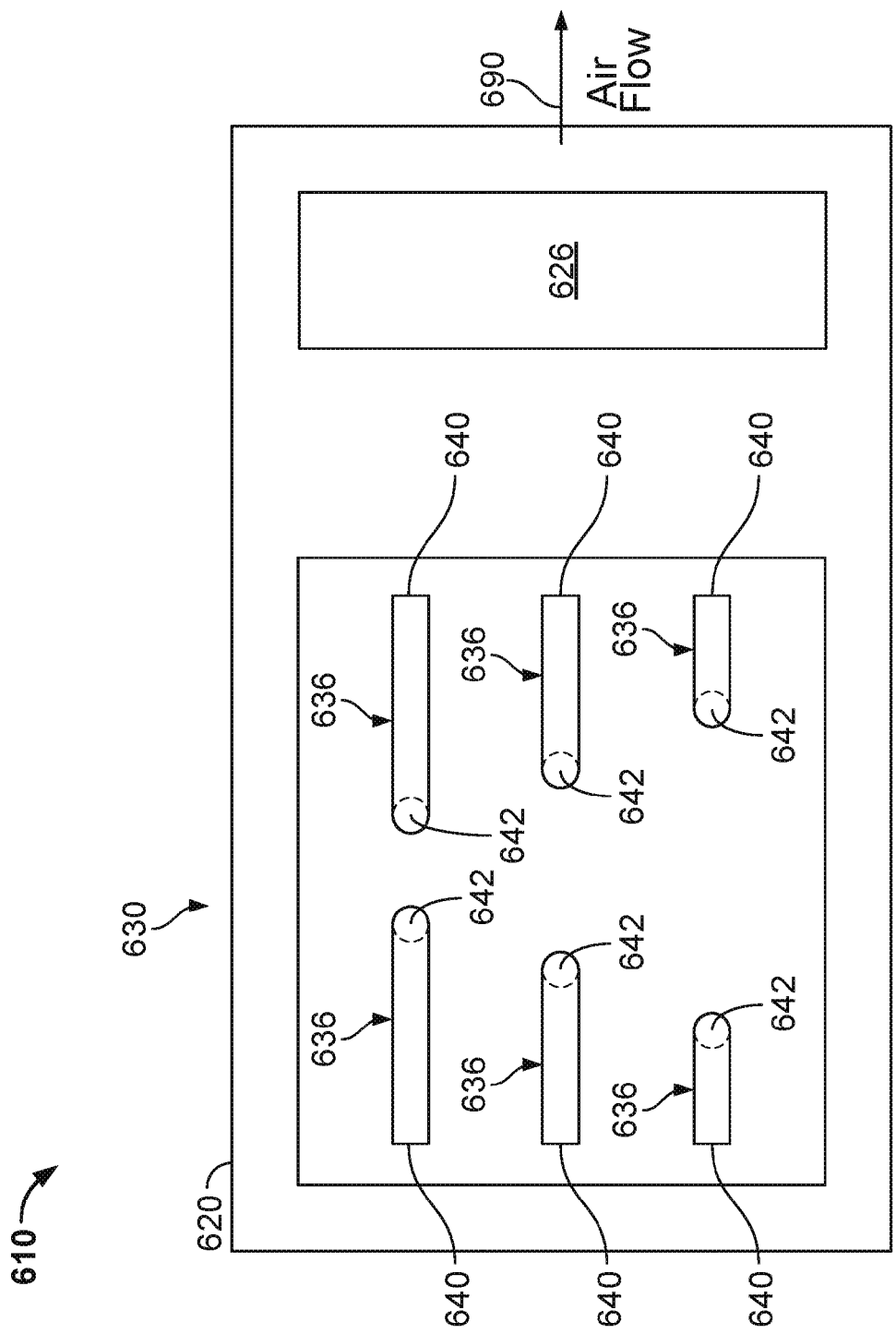

FIGS. 6A-6B illustrate a side and a sectional top schematic view, respectively, of another example implementation of a modular heat sink for a server-rack sub-assembly according to the present disclosure. In some aspects, the modular heat sink 630 may include multiple (e.g., two or more) transport tubes that fluidly connect an evaporator 632 with a condenser 634 to transfer heat, via a working fluid, from one or more heat-generating electronic devices 624 to an ambient environment. In the example modular heat sink 630, as shown, the condenser 634 is positioned vertically above the evaporator 632.

Referring to FIGS. 6A-6B, the modular heat sink 630 is shown with a server rack sub-assembly 610. The server-rack sub-assembly 610 includes a frame or cage 620, a printed circuit board 622, e.g., motherboard, supported on the frame 620, one or more heat-generating electronic devices 624, e.g., a processor or memory, mounted on the printed circuit board 622, and a modular heat sink 630. One or more fans 626 can also be mounted on the frame 620.

The modular heat sink 630 includes an evaporator 632, a condenser 634 mounted on top of the evaporator 632, and multiple transport tubes 636 connecting the evaporator 632 to the condenser 634. The evaporator 632 contacts the electronic device 624 so that heat is drawn by conductive heat transfer from the electronic device 624 to the evaporator 632. For example, the evaporator 632 is in conductive thermal contact with the electronic device 624. In particular, the bottom of the evaporator 632 contacts the top of the electronic device 624 (e.g., directly or through a heat transfer surface such as a phase change material).

As shown in FIGS. 6A-6B, the condenser 634 is vertically positioned directly above the evaporator 632, which in some aspects, may allow for space savings on the frame 620. A heat transfer surface 638 (e.g., fins) is mounted to a top of the condenser 634. As shown in this example, multiple transport tubes 636 connect the evaporator 632 and the condenser 634. In this example, there are six transport tubes 636, however, there may be fewer (e.g., two through five) or more (e.g., more than six) transport tubes 636. As illustrated, one or more of the transport tubes 636 include an open end 642 that is open in a vapor phase 639 of the working fluid in the evaporator 632, and a closed end 640 that is positioned in a particular area of the condenser 634. Thus, in this example, the vapor phase 639 may fluidly travel into the open end 642 of the transport tube 636, and to the closed end 640 located in the condenser 634 (e.g., by pressure or thermal gradients). In some examples, each closed end 640 is positioned in an area of the condenser 634 that is thermally distinct from other areas of the condenser 634 (e.g., with little to no conductive heat transfer between adjacent areas of the condenser 634). Thus, in this example, the vapor phase 639 may fluidly travel into the open end 642 of the transport tube 636, and to the closed end 640 located in the condenser 634 (e.g., by pressure or thermal gradients).

In operation, heat from the electronic device 624 causes a liquid phase 637 of the working fluid (e.g., water or refrigerant) in the evaporator 632 to vaporize. As illustrated in FIG. 6A, the working fluid as the liquid phase 637 fills the evaporator 632 to a particular height within the volume of the evaporator 632, with working fluid vapor 639 (due to the transferred heat) above the liquid 637. The liquid 637, in some aspects, fills the evaporator 632 to a height above a finned surface within the evaporator 632 (not shown here). The evaporator 632, in this example, consists of a pocketed copper block with some fin structures (not shown). The fins could be machined/skived, or could be soldered/brazed as a separate part to the evaporator copper block. The fins can be plate fins or pin fins and can be coated with copper porous particles to increase the evaporation rate and reduce the thermal resistance.

The vapor 639 then passes through the open ends 642 of the transport tubes 636 to the condenser 634. Heat is radiated away from the condenser 634, e.g., into air around the condenser 634 or into air blown or drawn by the one or more fans 626 that passes across the condenser 634, one or more heat transfer surfaces 638 (e.g., finned surface), or both, causing the vapor phase 639 of the working fluid to condense within the transport tubes 636 (e.g., within the closed ends 640). The condensed vapor phase 639 may then circulate (e.g., fall) down the transport tubes 636 to the evaporator 632.

In the illustrated implementation, the liquid phase 637 of a working fluid can flow through a portion of the transport tubes 636, and the vapor phase 639 (or mixed vapor-liquid phase) of the working fluid can flow through another portion of the transport tubes 636. Further, in some aspects, the transport tubes 636 may include respective wick structures, which helps circulate the liquid 637 back to the evaporator 632 (and the vapor 639 to the condenser 634) through capillary forces In some alternative implementations, the modular heat sink 630 can have multiple evaporators; and each evaporator can contact a different electronic device, or multiple evaporators could contact the same electronic device, e.g., if the electronic device is particularly large or has multiple heat generating regions. The multiple evaporators can be connected by the transport tubes 636 to the condenser 634 in series, e.g., all of the transport tubes 636 connects the condenser 634 to a first evaporator and a second evaporator. Alternatively, each of the multiple evaporators can be connected by a subset of the transport tubes 636 to the condenser 634 in parallel, e.g., a first subset of transport tubes 636 connects the condenser to a first evaporator, and a second subset of transport tubes 636 connects the condenser 634 to a second evaporator. Advantages of a serial implementation may be fewer tubes, whereas an advantage of parallel tubes is that the tube diameters can be smaller.

As shown in FIGS. 6A-6B, the closed ends 640 of the transport tubes 636 are positioned, and the transport tubes 636 terminate in, distinct areas of the condenser 634. As shown in FIG. 6B, the closed ends 640 may be positioned within a common plane within the condenser 634 but at differing distances from the fan 626. Thus, in some aspects, transport tubes 636 that have closed ends 640 further from the fan 626 may receive a cooling airflow 690 from the fan 626 that is cooler than the cooling airflow 690 received by transport tubes 636 with closed ends 640 that are positioned closer to the fan 626. In some examples, a particular location of each closed end 640 of the transport tubes 636 may be selected or designed to maximize heat transfer from the vapor phase 639 of the working fluid in the transport tubes 636 to the cooling airflow 690. For instance, it may be preferable or desirable to have each transport tube 636 have an equal or roughly equal heat transfer capacity. Thus, due to, for example, the different lengths of the transport tubes 636 (e.g., due to the different locations of the closed ends 640 of the various transport tubes 636), various cooling fluid temperatures (e.g., based on a distance between the fan 626 and a respective closed end 640 of a transport tube 636) may balance the heat transfer capacities across the transport tubes 636.

A number of embodiments have been described. Nevertheless, it will be understood that various modifications may be made without departing from the spirit and scope of what is described. Accordingly, other embodiments are within the scope of the following claims.

What is claimed is:

1. A data center cooling system, comprising:
   a modular heat sink, comprising:
   an evaporator configured to thermally contact a heat-generating electronic device to receive heat from the data center heat-generating electronic device;
   a condenser coupled to the evaporator and configured to transfer the heat from the heat-generating electronic device into a cooling fluid; and
   a plurality of transport tubes that fluidly couple the evaporator and the condenser, the plurality of transport tubes extending through a housing of the condenser and into an interior volume of the condenser such that the plurality of transport tubes are structurally independent from a structure of the condenser, each of the plurality of transport tubes comprising an open end positioned in the evaporator and each of the plurality of transport tubes comprises a closed portion that extends from a location at the housing of the condenser and terminates in a closed end that is positioned in the interior volume of the condenser, the closed ends of the plurality of transport tubes positioned in respective areas of the condenser that comprise distinct thermal areas of the condenser such that at least a portion of the plurality of transport tubes have distinct effective lengths measured from the respective open ends of the portion of the plurality of transport tubes to the respective closed ends of the portion of the plurality of transport tubes; and
   a working fluid that vaporizes in the evaporator based on receipt of the heat from the heat-generating electronic device, and circulates, in vapor phase, from the evaporator to the condenser in the transport member, and circulates, in liquid phase, from the condenser to the evaporator,
   wherein the working fluid inside each closed portion of the transport tubes positioned in the interior volume of the condenser is fluidly decoupled from the working fluid inside the other closed portions of the transport tubes positioned in the interior volume of the condenser.

2. The data center cooling system of claim 1, wherein the working fluid comprises water, and the evaporator comprises copper.

3. The data center cooling system of claim 2, wherein the water comprises deionized or reverse osmosis (RO) water.

4. The data center cooling system of claim 1, further comprising a fan positioned to circulate a cooling fluid over the condenser.

5. The data center cooling system of claim 4, wherein the fan is mounted on a frame of a server board sub-assembly that supports the heat-generating electronic device.

6. The data center cooling system of claim 1, further comprising a heat transfer surface positioned within an inner volume of the evaporator.

7. The data center cooling system of claim 6, wherein the heat transfer surface comprises copper fins integrally formed with the evaporator.

8. The data center cooling system of claim 7, wherein the copper fins extend upward from a bottom surface of the inner volume of the evaporator, and a height of the finned structure is less than an operating liquid level of the working fluid in the evaporator.

9. The data center cooling system of claim 6, wherein at least a portion of the heat transfer surface is coated with a porous coating.

10. The data center cooling system of claim 9, wherein the porous coating comprises copper particles.

11. The data center cooling system of claim 1, wherein the condenser is mounted vertically above the evaporator.

12. The data center cooling system of claim 1, wherein the condenser is mounted to a frame of a server board sub-assembly that supports the heat-generating electronic device.

13. The data center cooling system of claim 1, wherein the plurality of transport tubes comprise heat pipes that each comprise a wick structure.

14. A method for cooling data center electronic devices, comprising:
   vaporizing at least a portion of a working fluid in an evaporator of a modular heat sink with heat from a heat-generating electronic device in thermal contact with the evaporator;
   circulating a vapor phase of the working fluid from the evaporator through respective open ends of a plurality of transport tubes that fluidly couple the evaporator to a condenser of the modular heat sink, the respective open ends positioned in the evaporator;

condensing at least a portion of the vapor phase of the working fluid, in respective closed portions of the plurality of transport tubes that extend into an interior volume of the condenser and from a housing of the condenser such that the plurality of transport tubes are structurally independent from a structure of the condenser, the plurality of transport tubes terminating in closed ends within the interior volume of the condenser, to a liquid phase of the working fluid, the closed ends of the plurality of transport tubes positioned in respective areas of the condenser that comprise distinct thermal areas of the condenser such that the plurality of transport tubes have distinct effective lengths measured from the respective open ends of the portion of the plurality of transport tubes to the respective closed ends of the portion of the plurality of transport tubes; and circulating the liquid phase of the working fluid to the evaporator through the plurality of transport tubes such that the working fluid inside each of the transport tubes is fluidly decoupled from the working fluid inside the other transport tubes.

15. The method of claim 14, wherein the working fluid comprises water, and the evaporator comprises copper.

16. The method of claim 15, wherein the water comprises deionized or reverse osmosis (RO) water.

17. The method of claim 14, further comprising circulating a cooling airflow over the condenser.

18. The method of claim 17, wherein circulating the cooling airflow comprises circulating the cooling airflow with a fan mounted on a frame of a server board subassembly that supports the heat-generating electronic device.

19. The method of claim 14, further comprising transferring heat from the heat-generating electronic device, through a heat transfer surface positioned within an inner volume of the evaporator, to the liquid phase of the working fluid.

20. The method of claim 19, wherein at least a portion of the heat transfer surface is coated with a porous coating comprising copper particles.

21. The method of claim 14, wherein the condenser is mounted vertically above the evaporator.

22. The method of claim 14, wherein the plurality of transport tubes comprise heat pipes that each comprise a wick structure.

23. The data center cooling system of claim 4, wherein respective closed ends of the portion of the plurality of transport tubes are positioned in a common plane within the condenser.

24. The data center cooling system of claim 23, wherein the respective closed ends of the portion of the plurality of transport tubes are closer to the fan than respective closed ends of another portion of the plurality of transport tubes.

25. The data center cooling system of claim 1, wherein adjacent distinct thermal areas of the condenser have substantially no conductive heat transfer therebetween.

26. The method of claim 17, wherein respective closed ends of the portion of the plurality of transport tubes are positioned in a common plane within the condenser.

27. The method of claim 26, wherein the respective closed ends of the portion of the plurality of transport tubes are closer to a fan that circulates the cooling airflow than respective closed ends of another portion of the plurality of transport tubes.

28. The method of claim 14, wherein adjacent distinct thermal areas of the condenser have substantially no conductive heat transfer therebetween.

29. The data center cooling system of claim 1, wherein the working fluid inside each transport tube is fluidly decoupled from the working fluid inside the other transport tubes between respective open ends of the plurality of transport tubes and respective closed ends of the plurality of transport tubes.

30. The data center cooling system of claim 1, wherein the effective length of each transport tube is proportional to a thermal resistance between a surface of the heat-generating electronic device and the cooling fluid adjacent the closed ends of the transport tubes.

31. The data center cooling system of claim 1, wherein each of the plurality of transport tubes comprises a cross-sectional area that is a fraction of a total cross-sectional flow area of a flow path for the liquid phase of the working fluid to flow from the condenser to the evaporator.

* * * * *

UNITED STATES PATENT AND TRADEMARK OFFICE
CERTIFICATE OF CORRECTION

PATENT NO. : 10,349,561 B2
APPLICATION NO. : 15/208951
DATED : July 9, 2019
INVENTOR(S) : Farshchian et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 31 days.

Signed and Sealed this
Twenty-sixth Day of May, 2020

Andrei Iancu
*Director of the United States Patent and Trademark Office*